United States Patent

Nose et al.

Patent Number: 5,817,208
Date of Patent: Oct. 6, 1998

[54] RESIN SEALING DIE, RESIN-SEALED-TYPE SEMICONDUCTOR DEVICE AND METHOD OF MANUFACTURING THE DEVICE

[75] Inventors: Sachiyuki Nose, Nagaokakyo; Minako Onoe, Kyoto, both of Japan

[73] Assignee: Matsushita Electronics Corporation, Japan

[21] Appl. No.: 691,845

[22] Filed: Aug. 1, 1996

[30] Foreign Application Priority Data

Aug. 4, 1995 [JP] Japan ................................. 199771

[51] Int. Cl.⁶ ..................................................... B29B 31/00
[52] U.S. Cl. ......................... 156/500; 156/581; 156/583.1
[58] Field of Search ................................... 156/500, 580, 156/581, 583.1

[56] References Cited

U.S. PATENT DOCUMENTS

| | | | |
|---|---|---|---|
| 4,384,702 | 5/1983 | Boskovic | 249/103 |
| 5,663,104 | 9/1997 | Fukuyama | 438/123 |

FOREIGN PATENT DOCUMENTS

| | | |
|---|---|---|
| 2 644 610 | 9/1990 | France . |
| 59-028 350 A | 2/1984 | Japan . |
| 60-193 347 | 10/1985 | Japan . |
| 62-14737 | 1/1987 | Japan . |
| 62-221 138 A | 9/1987 | Japan . |
| 4-22 142 A | 1/1992 | Japan . |
| 6-120 281 A | 4/1994 | Japan . |
| 679917 | 5/1992 | Switzerland . |
| 89/02831 | 4/1989 | WIPO . |

OTHER PUBLICATIONS

Patent Abstracts of Japan, E–field, vol. 8, No. 115, (16 E 247), May 29, 1984, JP 59–028 350 A (Nippon Denki K.K.).
Patent Abstracts of Japan, E–field, vol. 10, No. 35 (119 E 380), Feb. 12, 1986, JP 60–193 347 A (Toshiba K.K.).
Patent Abstracts of Japan, E–field, vol. 18, No. 403, (122 E 1584), Jul. 27, 1994, JP 06–120 281 A (Hitachi Ltd.).
Patent Abstracts of Japan, E–field, vol. 12, No. 085, (96 E 591), Mar. 17, 1988, JP 62–221 138 A (Akita Denshi K.K.).
Patent Abstracts of Japan, vol. 16, No. 185 (E–1197), May 6, 1992 & JP–A–04 022142 (Sharp Corp), Jan. 27, 1992 (Abstract only).
Patent Abstracts of Japan, vol. 10, No. 145 (E–407) [2202] May 28, 1986 & JP–A–61 007635 (Toshiba KK), Jan. 14, 1986 (Abstract only).
Patent Abstracts of Japan, vol. 11, No. 145 (E–505), May 12, 1987 & JP–A–61 284932 (Yamagata Nippon Denki KK), Dec. 15, 1986 (Abstract only).

*Primary Examiner*—James Sells
*Attorney, Agent, or Firm*—Parkhurst & Wendel

[57] ABSTRACT

The present invention intends to improve the productivity and reliability of a resin-sealed-type semiconductor device. Therefore, the invention provides a resin sealing die for integrally molding a semiconductor chip, a lead frame to which the semiconductor chip is fixed, and metal wires which electrically connect the electrode terminals of the semiconductor chip to the inner leads of a head frame with sealing resin to manufacture a resin-sealed-type semiconductor device, wherein a cavity of the resin sealing die is formed at a portion where separable upper and lower dies confront each other, at least one of the upper surface of the cavity of the upper die and the lower surface of the cavity of the lower die comprises an engraved hole, and a metal block having a mark carved on a reference surface thereof facing the cavity is detachably attached to the engraved hole. The mark is imprinted on the surface of the resin-sealed-type semiconductor device concurrently with the resin molding, thereby realizing a relief marking.

10 Claims, 6 Drawing Sheets

RESIN SEALING DIE, RESIN-SEALED-TYPE SEMICONDUCTOR DEVICE AND METHOD OF MANUFACTURING THE DEVICE

FIELD OF THE INVENTION

The present invention relates to a resin sealing die having a function of transferring symbols such as a trademark, a name, a manufacturing site, a manufacturing date, etc. which are carved thereon onto the surface of a resin-sealed-type semiconductor device, the resin-sealed-type semiconductor device and a method of manufacturing the resin-sealed-type semiconductor device.

BACKGROUND OF THE INVENTION

Figure 7:
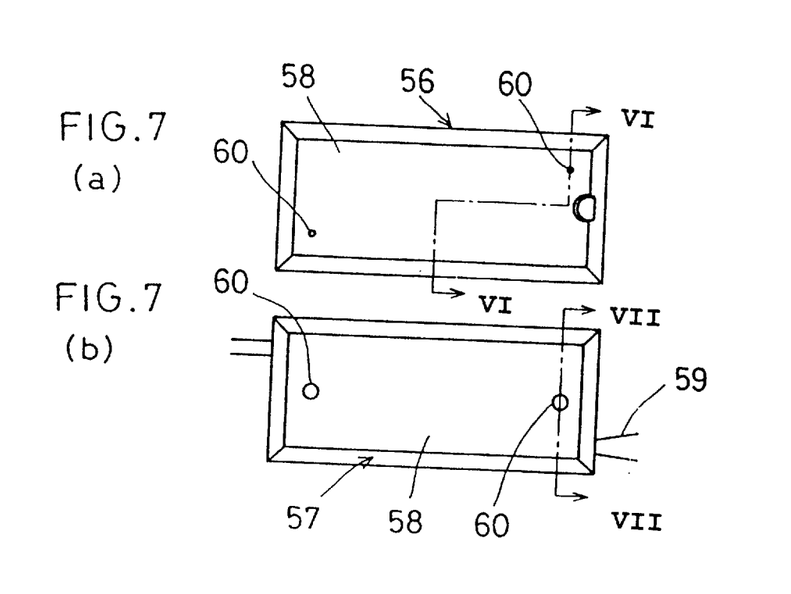
Figure 8:
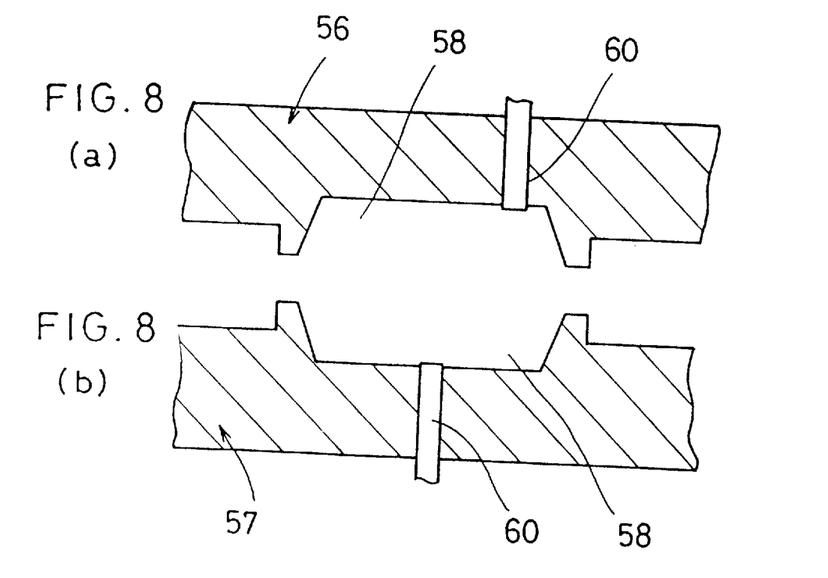
Figure 9:
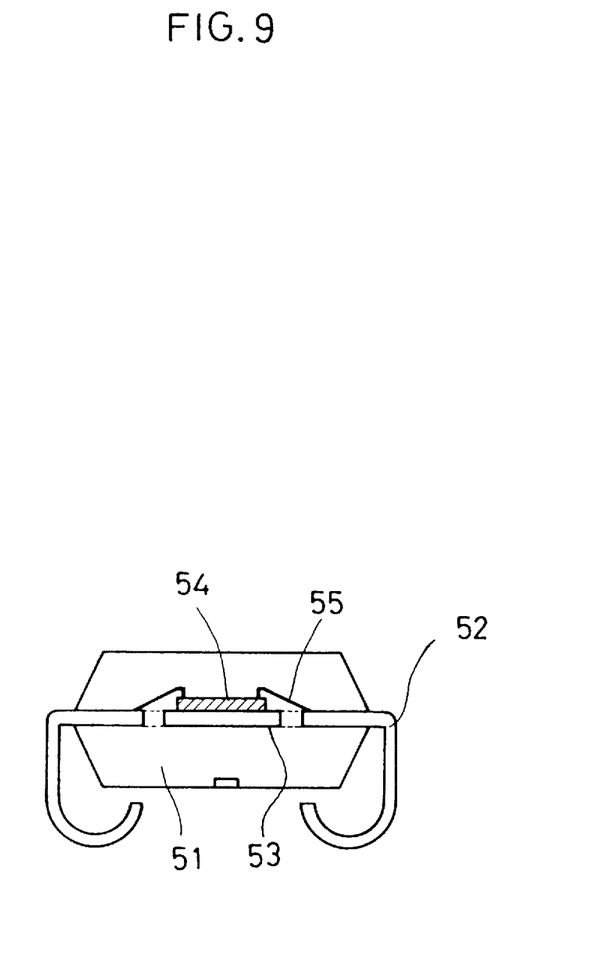
FIG. 9 is a cross sectional view of a resin-sealed-type semiconductor device resin-molded using the resin sealing die of the prior art.

A prior art will be described with reference to FIGS. 7 to 9. FIGS. 7 (a) and 7 (b) are the plan views of upper and lower dies of a conventional resin sealing die, FIG. 8 (a) is a sectional view of FIG. 7 (a) taken along line VI—VI, FIG. 8 (b) is a sectional view of FIG. 7 (b) taken along line VII—VII and FIG. 9 is a cross sectional view of a resin-sealed-type semiconductor device subjected to resin molding using the resin sealing die.

A resin-sealed-type semiconductor device 51 is made of thermosetting or thermoplastic resin by way of pressure injection molding under a temperature (150° C. –400° C.) condition at which temperature the resin melts. In order to subject the resin to the pressure injection molding, first a semiconductor chip 54 to be sealed in resin is bonded onto the die pad 53 of a lead frame using silver paste, tin-lead solder, gold silicide or the like, or connected thereto by way of eutectic. Then, electrode terminals on the main surface of the semiconductor chip 54 are connected to the gold- or silver-plated tip end portions (inner leads) of leads 52 respectively via metal wires 55 made of gold, copper etc. by way of ultrasonic thermocompression bonding, and the semiconductor chip 54 is arranged on a predetermined position of a lower die 57 of the resin sealing die which is composed of an upper die 56 and the lower die 57, but at this stage, the leads 52 projecting from the resin are not bent yet.

Then, the lower die 57 is raised to a position where the surface of the lead frame provided at a predetermined position of the lower die 57 is clamped by the upper and lower dies 56 and 57 so that a predetermined pressure is applied to the surface of the lead frame. In this state, the aforementioned sealing resin is injected under pressure from a resin pool of the die into a cavity 58 via a runner portion and a gate portion 59, so that the resin-sealed-type semiconductor device 51 is formed in the shape of the cavity 58. After the completion of injecting the resin, the resin-sealed-type semiconductor device 51 in which the inner leads, the semiconductor chip 54 and the metal wires 55 are sealed is held in the resin sealing die for a predetermined period of time until the primary cross-linking reaction of the resin is completed.

Thereafter, the lower die 57 is lowered to open the resin sealing die, when an ejector pin 60 incorporated in the upper die 56 projects into the cavity 58 to push the upper surface of the molded resin-sealed-type semiconductor device 51, thereby releasing the same from the upper die 56. The lower die 57 is further lowered and an ejector pin 60 incorporated in the lower die 57 pushes the lower surface of the resin-sealed-type semiconductor device 51, thereby releasing the same from the lower die 57.

Particularly releasing the resin-sealed-type semiconductor device 51 from the lower die 57 is performed while the sealing resin is exposed to the room temperature so that it contracts in size facilitating the release. The resin-sealed-type semiconductor device 51 is subjected to aging for the purpose of annealing and secondary cross-linking reaction, when it is heated for a predetermined period of time at a temperature higher than the glass transition temperature of the sealing resin. In the succeeding process, a metal coating of tin-lead alloy is formed on the surface of outer leads by way of electroplating or soaking the outer leads in the aforementioned melted alloy in a tank. Further, dambars connecting the outer leads to each other are cut by a cutting die and then formed to desired shapes using a forming die to complete the resin-sealed-type semiconductor device 51 having a predetermined outline.

The semiconductor chip 54 described above is sealed in the aforementioned resin-sealed-type semiconductor device 51, and the name of the semiconductor chip 54 is printed on the upper or lower surface of the resin-sealed-type semiconductor device 51. The method of printing a mark comprises the steps of applying printing ink onto a name stamp, transferring the ink onto the upper or lower surface of the resin-sealed-type semiconductor device 51 and curing the transferred ink by way of heating or ultraviolet degradation. For marking, it is necessary to previously remove fatty matter on the surface of the resin before transferring the ink in order to prevent the same from being peeled off or blurred due to the fatty matter. The methods of removing the fatty matter are cleaning the resin with organic solvent, burning the resin with oxyhydrogen flame, etc. As to the mark, a trademark, a manufacturing site, a manufacturing date and other informations are also printed other than the name. Marking the resin-sealed-type semiconductor device 51 is completed in this way.

According to the prior art, the inner lead portions of the leads 52, the semiconductor chip 54 and the metal wires 55 are integrally formed with sealing resin to manufacture the resin-sealed-type semiconductor device 51 having a desired outline, thereafter the name, manufacturing date etc. of the semiconductor chip 54 are marked on the surface of the resin-sealed-type semiconductor device 51 by way of transfer printing. The prior art, however, had a problem that the marking process was indispensable thereby increasing the number of manufacturing processes, and further causing an electrostatic breakdown. Moreover, it is necessary to perform total visual inspection for the thickness, breakage or misregistration of marked letters.

Furthermore, burning the surface of the resin-sealed-type semiconductor device 51 for preventing the mark from being peeled off exposes the surface of the resin to a high temperature if the burning time or the height of a torch are not properly set. Recent resin-sealed-type semiconductor devices 51 are light-weighed, thinned, shortened and miniaturized. As a result, the surface of the semiconductor chip 54 or the metal wires 55 are positioned just under the surface of the resin, so that exposing the surface of the resin to a high temperature causes the deterioration of the performance or quality of the semiconductor chip 54, and consequently the uneconomical production of defective products and the reduction of reliability.

DISCLOSURE OF THE INVENTION

Accordingly, it is the object of the invention to provide a resin sealing die, a method of manufacturing a resin-sealed-type semiconductor device capable of improving the productivity and reliability of the resin-sealed-type semiconductor device and the resin-sealed-type semiconductor device manufactured by the method.

A resin sealing die according to the present invention is a resin sealing die for manufacturing the resin-sealed-tpe semiconductor device by sealing a semiconductor chip with sealing resin, wherein a cavity of the resin sealing die is formed at a portion where separable upper and lower dies confront each other, at least one of the upper and lower dies comprising an engraved hole which is open to the cavity, and a metal block having a mark carved on the reference surface thereof facing the cavity is detachably attached to the engraved hole.

In the resin sealing die having the aforementioned structure, when a to-be-molded body composed of the semiconductor chip, the lead frame, the metal wires etc. is integrally formed with sealing resin, it is possible to carve a mark on the front or back surface of the molded body concurrently therewith, thereby realizing a relief marking. Further, it is easy to change the mark by exchanging the mark-carved metal block attached to the engraved hole with that having a different mark carved thereon.

Thus, the marking process of the conventional transfer printing can be completely eliminated to enable the reduction of cost. Further the ink which remains in the marking process of the conventional transfer printing need not be produced as industrial waste. Moreover, the mark becomes clearer compared with a laser mark, and since the surface of the semiconductor chip or metal wires inside the resin-sealed-type semiconductor device are not heated, the influence of heating on the quality can be eliminated. Furthermore, since the mark is imprinted by the metal block 11 of the resin sealing die, the disappearance, blur, deformation, misregistration, etc. of the mark generated by the conventional transfer printing are eliminated, thereby enabling unmanned visual inspection or simplified visual inspection system to reduce cost. Exchanging the mark of the metal block for switching the product type can be performed with the temperature remaining high.

A resin sealing die according to the present invention is a resin sealing die for manufacturing the resin-sealed-type semiconductor device by sealing the semiconductor chip with sealing resin, wherein the cavity of the resin sealing die is formed at a portion where the separable upper and lower dies confront each other, at least one of the upper and lower dies comprising an engraved hole which is open to the cavity and a through-hole which communicates with the engraved hole, and a metal block having a mark carved on the reference surface thereof facing the cavity is fit in the engraved hole to be movable back and forth therein, and wherein an ejector pin is inserted in the through-hole, the tip end of the ejector pin being connected to the metal block so as to project the metal block into the cavity by way of the ejector pin when the upper and lower dies are released from each other.

Owing to the structure described above, a mark is imprinted on the surface of the resin-sealed-type semiconductor device concurrently with the resin molding thereof to form a relief mark thereon. Further, since the semiconductor device is released from the die by projecting the metal block into the cavity using the ejector pin, it is possible to make the metal block function as an ejector pin, thereby realizing the stable release of a resin-molded product from the resin sealing die.

A resin sealing die according to an embodiment of the invention comprises a metal block having a mirror- or satin-finished reference surface.

The above-described structure realizes an outline finish of the resin-sealed-type semiconductor device taking into consideration a contrast between the surface thereof facing the reference surface and the surface surrounding that. Further, making the mark area and the area surrounding that similar to each other in surface condition realizes a natural mark compatible with circumference.

A resin sealing die according to another embodiment comprises a metal block having a reference surface divided into a plurality of areas respectively having different marks carved thereon.

As described above, partitioning the marking area with frames etc. facilitates identifying the marks when there are many marks carved on the surface of the resin-sealed-type semiconductor device.

A resin sealing die according to another embodiment comprises the reference surface of a metal block divided into a plurality of areas, one of the divided areas having a recess formed therein, to which a marking die is fit.

The above-described structure makes it possible to change a mark at need in one of the divided areas so as to easily exchange a mark which always has to be changed such as a manufacturing date, so that it is economical.

A resin sealing die according to another embodiment comprises the reference surface of a metal block or that formed by combining a plurality of metal blocks, the reference surface having a shape of one of a rectangle, a rectangle having four rounded corners, a rhombus, a rhombus having rounded corners, a circle, an ellipse and a rectangle having two confronting circular or elliptic sides.

As described above, it is possible to change the reference surface of the metal block to a well-balanced shape in accordance with the external shape of the resin-sealed-type semiconductor device. It is also possible to reduce the sliding resistance of the metal block by forming the reference surface to these shapes when the metal block is projected into the cavity using an ejector pin to release the resin-molded product from the resin sealing die.

A resin sealing die according to yet another embodiment comprises the reference surface of a metal block, the reference surface having a mark formed concave or convex relative to the portion of the reference surface where the mark is not carved.

The above-described structure makes it possible to clearly form concave or convex letters of high quality on the surface of the resin-sealed-type semiconductor device. Since concave and convex letters are carved on the metal block surfaces for thin and thick devices respectively, it does not influence the structural design and reliability of the resin-sealed-type semiconductor device.

A resin sealing die according to another embodiment comprises the reference surface of a metal-block, the mark-carved reference surface comprising a frame at the outer peripheral edge thereof.

Owing to the above-described structure, the frame prevents the mark from being broken at the time of handling the semiconductor device. The frame also serves as the frame of reference for recognition at the time of inspection with an inspection equipment, so that the frame can be used for positional recognition at the time of high accuracy inspection.

A method of manufacturing a resin-sealed-type semiconductor device according to another embodiment is that of forming a resin-sealed-type semiconductor device of thermoplastic or thermosetting resin using the resin sealing die according to the present invention.

The above-described structure eliminates the marking process by way of transfer printing which was necessary before, thereby realizing the improvement of productivity, unmanned visual inspection and simplified visual inspection system. In addition, the surface of the resin need not be heated at a high temperature, so that it is possible to maintain a high quality and improve reliability.

A resin-sealed-type semiconductor device according to the present invention has a mark composed of concave or convex letters or symbols relative to the reference surface, the mark being carved on the front and/or back surface of the semiconductor device in which a semiconductor chip is sealed with sealing resin.

Owing to the above-described structure, it is possible to overcome many problems of the semiconductor device caused by the mark and manufacture a semiconductor device which is clearly marked, low cost and highly reliable.

A resin-sealed-type semiconductor device according to one embodiment comprises a frame portion formed integrally with the semiconductor device in which a semiconductor chip is sealed with sealing resin on the front and/or back surface thereof in such a manner as to surround the mark area.

The above-described structure prevents the mark from being broken. The frame also serves as the frame of reference for recognition at the time of inspection using an inspection equipment, thereby enabling a high accuracy inspection.

BRIEF DESCRIPTION OF THE DRAWINGS

FIG. 1 (a) is a plan view of the upper die of a resin sealing die according to a first embodiment of the invention and FIG. 1 (b) is a plan view of the lower die thereof;

FIG. 2 (a) is a cross sectional view of FIG. 1 (a) taken along line II—II and FIG. 2 (b) is a cross sectional view of FIG. 1 (b) taken along line III—III;

FIG. 4 (a) is a perspective view of a resin-sealed-type semiconductor device which is resin-molded using the resin sealing die of the first embodiment and has a convex mark carved thereon and FIG. 4 (b) is an external view of a resin-sealed-type semiconductor device which has a concave mark carved thereon;

FIG. 5 (a) is a plan view of the upper die of the resin sealing die according to a second embodiment of the invention and FIG. 5 (b) is a plan view of the lower die thereof.

FIG. 6 (a) is a cross sectional view of FIG. 5 (a) taken along line IV—IV and FIG. 6 (b) is a cross sectional view of FIG. 5 (b) taken along line V—V;

FIG. 7 (a) is a plan view of the upper die of a resin sealing die according to a prior art and FIG. 7 (b) is a plan view of the lower die thereof;

FIG. 8 (a) is a cross sectional view of FIG. 7 (a) taken along line VI—VI and FIG. 8 (b) is a cross sectional view of FIG. 7 (b) taken along line VII—VII.

DETAILED DESCRIPTION OF THE PREFERRED EMBODIMENTS

The first embodiment of the invention will be described with reference to FIGS. 1 to 4.

Figure 1:
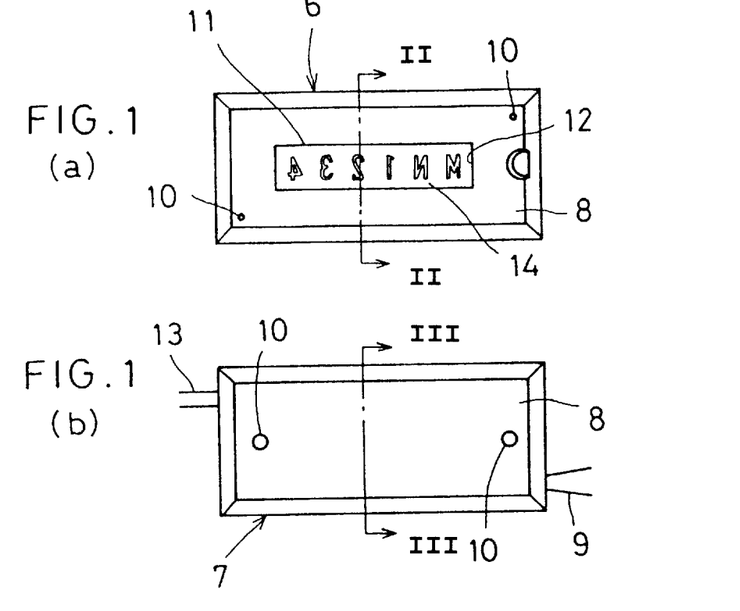
Figure 2:
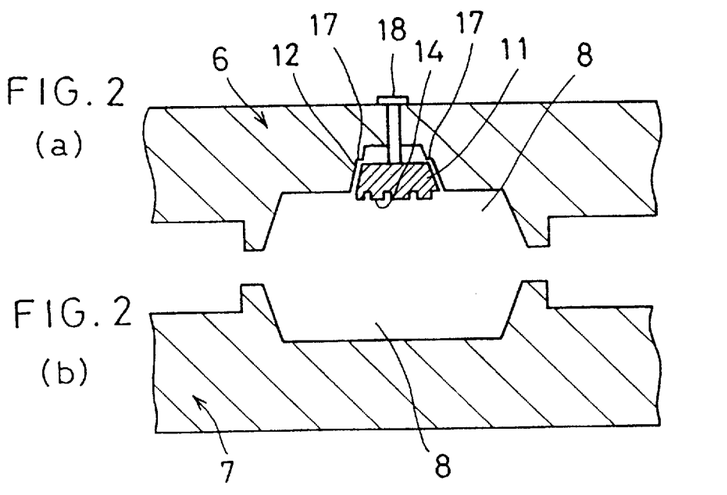
Figure 3:
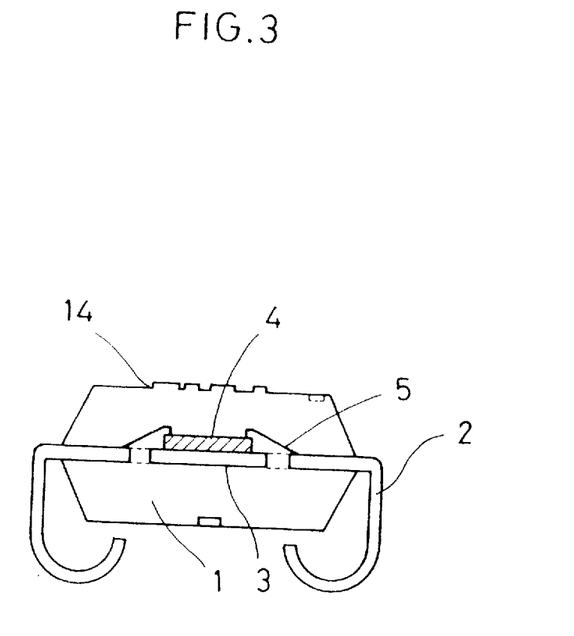
FIG. 3 is a cross sectional view of a resin-sealed-type semiconductor device resin-molded using the resin sealing die of the first embodiment.
Figure 4:
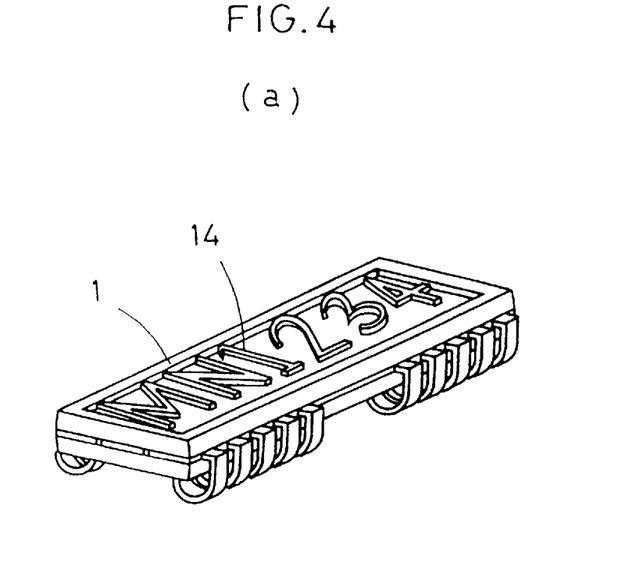

FIGS. 1 (a) and 1 (b) are the plan views of the upper and lower dies of a resin sealing die according to a first embodiment of the invention, FIGS. 2 (a) and 2 (b) are the cross sectional views of FIG. 1 (a) taken along line II—II and taken along line III—III respectively, FIG. 3 is a cross sectional view of a resin-sealed-type semiconductor device resin-molded using the resin sealing die and FIG. 4 (a) is a perspective view of a resin-sealed-type semiconductor device which is resin-molded using the resin sealing die.

The resin sealing die integrally forms with sealing resin a semiconductor chip 4, a lead frame to which the semiconductor chip 4 is fixed and metal wires 5 which electrically connect the electrode terminals of the semiconductor chip 4 to the inner leads of leads 2. In the resin sealing die, a cavity 8 for manufacturing a resin-sealed-type semiconductor device 1 is formed at a portion where an upper die 6 and a lower die 7 confront each other, the upper die 6 and lower die 7 being able to be separated from each other. An engraved hole 12 which is open to the cavity 8 is provided in at least one of the upper die 6 and the lower die 7, and a metal block 11 having a mark 14 carved on the reference surface thereof facing the cavity 8 is detachably attached to the engraved hole 12. The mark 14 includes a trademark, a name, a performance etc. or letters, which are carved in necessary size and at necessary position.

In this case, the gap between the outer wall surface of the metal block 11 and the inner side surface of the engraved hole 12 is set to 2–$\mu$m in a state in which the metal block 11 is fit in the engraved hole 12. The reference surface of the metal block 11, the reference surface having the mark 14 carved thereon, is set in such a way as to conform to the upper surface of the cavity 8 of the upper die 6 or to be different in height therefrom by ±500 $\mu$m. For setting, the engraved hole 12 is designed to have a stopper surface 17 provided therein so as to determine the height of the metal block 11 by bringing the bottom surface of the metal block 11 in contact with the stopper surface 17. Further, in order to prevent the metal block 11 from coming off during the sealing resin molding, a through-hole reaching the engraved hole is provided in the upper die 6 to fix the metal block 11 with a screw 18 which is inserted through the through-hole. As shown in FIG. 1 (b), the lower die 7 comprises a gate portion 9 for injecting resin into the cavity 8, an air vent 13 for exhausting air and an ejector pin 10 for releasing a molded product from the die, the ejector pin 10 being provided to freely project into or contract from the cavity 8. The manufacturing site and manufacturing date may be included in the mark 14, but they may be provided on the upper surface of the resin-sealed-type semiconductor device 1 at a position other than the mark 14, or on the back surface of the resin-sealed-type semiconductor device 1.

The method of manufacturing the resin-sealed-type semiconductor device 1 will now be described.

In order to resin-mold the resin-sealed-type semiconductor device 1 with thermosetting sealing resin using the resin sealing die having the above-described structure, the resin sealing die is heated at 150° C.–200° C. at which resin such as phenol-novolak-epoxy, biphenyls or the like melts. Then, a previously heated sealing resin tablet is inputted from a predetermined position of the resin sealing die and sealing resin is injected under pressure into the cavity 8 via the entrance of the gate portion 9. At this time, air inside the cavity 8 is exhausted via the air vent 13. The melted sealing resin covers therein the to-be-sealed body installed on the lower die 7 at a predetermined position, the body being constituted of the leads 2 of the lead frame, the semiconductor chip 4 and the metal wires 5. Then, the sealing resin congeals in a shape conforming to the inner surface of the cavity 8 which defines the shape of the device, and thereafter is pushed out by the ejector pin 10.

At this time, the mark 14 such as a trademark or letters on the surface of the metal block 11 embedded in the upper die 6 and/or the lower die 7 is imprinted on the resin surface of the resin-sealed-type semiconductor device 1. The trademark or letters are formed in a concave or convex shape on the surface of the metal block 11. Convex and concave letters are selectively carved on thin and standard or thick resin-sealed-type semiconductor devices 1 respectively. The mark is easy to see when the height of the concave or convex letters is within a range of that of the reference surface ±500 μm. In this way the resin-sealed-type semiconductor device having the mark 14 carved thereon can be manufactured.

When the manufacturing the resin-molded, resin-sealed-type semiconductor device 1 having a specified name thereon is completed, the metal block 11 in the engraved hole 12 is taken out and another metal block 11 having the name to be next resin-sealed is embedded in the die. The exchanging operation of the metal block 11 is performed without returning the temperature of the resin sealing die to the room temperature. The following processes are the same as those described above.

In case of a conventional resin sealing die, the to-be-molded body constituted of a lead frame, a semiconductor chip and metal wires are integrally resin-molded with sealing resin, and the trademark, the name, the performance, the manufacturing site and the manufacturing date are printed on the molded body by transfer printing in a marking process after the processes of plating and forming the outer leads. On the other hand, according to this embodiment, the metal block 11 comprising the mark 14 such as the trademark, the name, the performance, the manufacturing site and the manufacturing date and the like carved thereon is incorporated in the upper die 6 and/or the lower die 7 of the resin sealing die, so that it is possible to imprint the mark 14 on the surface of the resin-sealed-type semiconductor device 1 concurrently with resin molding by resin-molding the to-be-molded body constituted of the leads 2 of the lead frame, the semiconductor chip 4 and the metal wires 5 integrally with sealing resin using the resin sealing die. The change of the mark 14 can be coped with exchanging the metal block 11 with that having a different mark 14 carved thereon.

This embodiment can thus completely eliminate the marking process of the conventional transfer printing to reduce cost. Further the ink which remains in the marking process of the conventional transfer printing need not be produced as industrial waste. Moreover, the mark 14 becomes clearer compared with a laser mark, and since the surface of the semiconductor chip 4 or metal wires 5 inside the resin-sealed-type semiconductor device are not heated, the influence of heating on the quality can be eliminated. Furthermore, since the mark 14 is imprinted by the metal block 11 of the resin sealing die, the visual inspection of the disappearance, blur, deformation, misregistration, etc. of the mark generated by the conventional transfer printing can be eliminated, thereby enabling abolishing visual inspection system to reduce cost. Furthermore, exchanging the mark 14 of the metal block 11 for switching the product type can be performed with the temperature remaining high.

Next, the second embodiment will be described now with reference to FIGS. 5 and 6.

Figure 5:
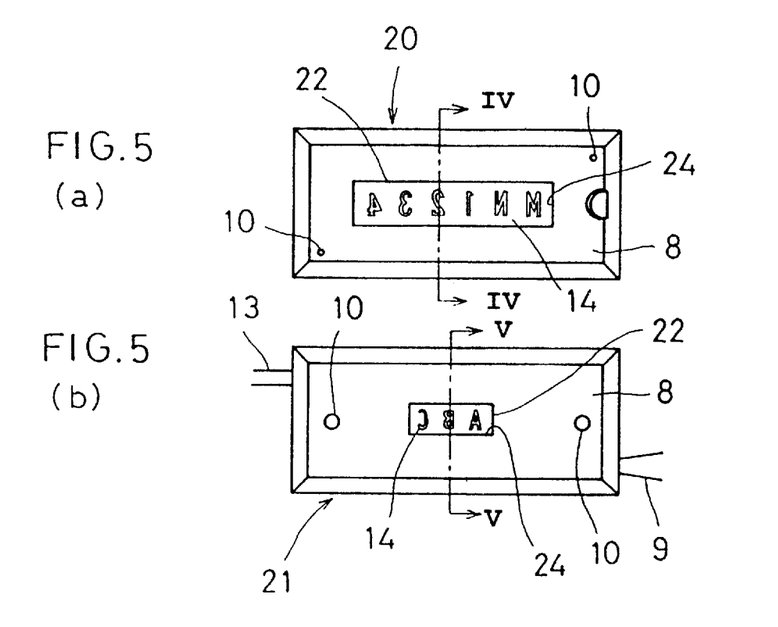
Figure 6:
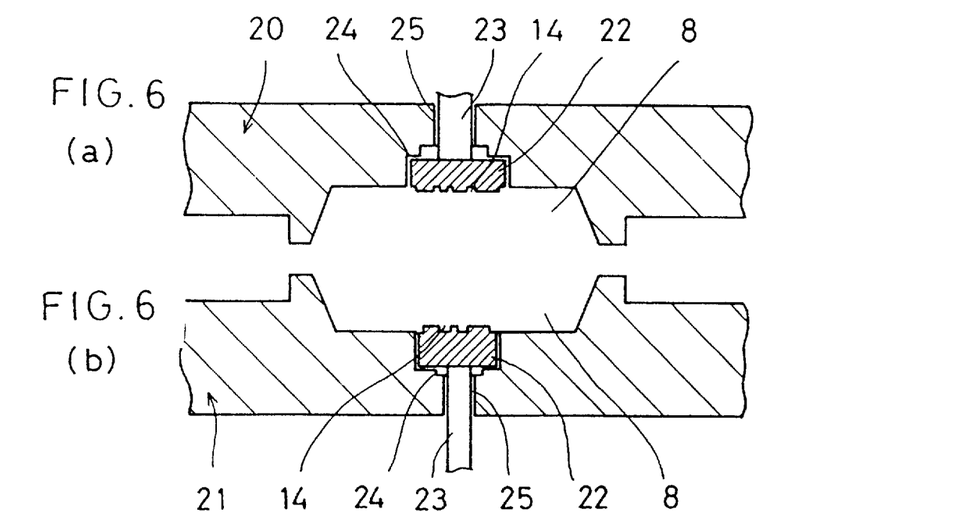

FIGS. 5 (a) and 5 (b) are plan views of the upper and lower dies of the resin sealing die according to the second embodiment and FIG. 6 (a) is a cross sectional view of FIG. 5 (a) taken along line IV—IV and FIG. 6 (b) is a cross sectional view of FIG. 5 (b) taken along line V—V.

The resin sealing die of this embodiment comprises an engraved hole 24 which is open to the cavity 8 and a through-hole 25 which allows the engraved hole 24 to communicate with the outside in at least one of the upper and lower dies 20 and 21. A metal block 22 having the mark 14 carved thereon on the reference surface facing the cavity 8 is fitted in the engraved hole 24 to be freely movable therein and an ejector pin 23 connected to the back surface of the metal block 22 is inserted in the through-hole 25. When the upper and lower dies 20 and 21 are released from each other, the metal block 22 is projected into the cavity 8 by way of the ejector pin 23. Thus in the resin sealing die, the metal block 22 has a function of releasing the resin-sealed-type semiconductor device 1 from the cavity 8 as an ejector pin after the device is resin-molded as well as that of carving a relief mark such as described in the first embodiment.

The engraved hole 24 is substantially of the same shape in plan view as the metal block 22, but there is provided a gap of 2–15 μm between the inner wall surface of the engraved hole 24 and the outer side surface of the metal block 22 and the metal block 22 slides in the engraved hole 24 toward the cavity 8 of the resin sealing die. The depth of the engraved hole 24 is set to be substantially equal to the thickness of the metal block 22. In this case, the corners of the metal block 22 are rounded and the corners of the engraved hole 24 are also formed to conform thereto. There may be provided a plurality of metal blocks 22 and a plurality of engraved holes 24 depending on the size and number of the marks 14, and the metal blocks 22 and the engraved holes 24 are provided in both of the upper die 6 and the lower die 7 in FIG. 6.

The through-hole 25 is provided at the central portion of the bottom surface of the engraved hole 24 to pierce the resin sealing die. A male wire is formed on the end portion of the ejector pin 23 which is inserted into the through-hole 25, the male wire engaging the female wire of the metal block 22 to fix the ejector pin 23 thereto. The ejector pin 23 slides toward the cavity 8 when the resin sealing die is opened after resin molding. Each ejector pin 23 and each metal block 22 provided in each cavity 8 of upper and lower dies 20 and 21 are designed to slide together for concurrently releasing the resin-molded product from each cavity 8 in the resin sealing die.

The method of manufacturing the resin-sealed-type semiconductor device 1 in this embodiment is substantially the same as that of the first embodiment, but after resin molding, the resin-molded product can be concurrently released from each cavity 8 inside the resin sealing die by way of the ejector pins 10 and the metal blocks 22 connected to the ejector pins 23 as described above.

According to this embodiment, the mark 14 is imprinted on the surface of the resin-sealed-type semiconductor device 1 concurrently with the resin molding thereof to realize a relief marking. Further, since the resin-sealed-type semiconductor device 1 is released from the die by projecting the metal block 22 into the cavity 8 using the ejector pin 23, the metal block 22 can be allowed to function as an ejector pin. Other effects of the structure are similar to those of the first embodiment.

Then the third embodiment will be described. In this embodiment, the reference surface of the metal block 11 (22) having the mark 14 carved thereon in the first or second embodiment is subjected to mirror finish or satin finish taking into consideration a contrast between the surface condition of the resin-sealed-type semiconductor device 1 and that of the metal block 11 (22).

Since the reference surface of the metal block 11 is subjected to mirror finish or satin finish in this embodiment, it is possible to realize the outline finish of the resin-sealed-type semiconductor device 1 taking into consideration a contrast between the surface thereof facing the reference surface, i.e., the mark area and the surface surrounding the same. Also, making the mark area and the area surrounding that similar to each other in surface condition realizes a natural mark compatible with circumference. Other effects of the construction are similar to those of the first and second embodiments.

The fourth embodiment will be described now. In this embodiment, the reference surface of the metal block in the first and second embodiments is divided by way of partitions into a plurality of areas respectively having different marks carved thereon.

According to this embodiment, the reference surface of the metal block 22 is divided into a plurality of areas, which have different marks carved thereon respectively, so that it is effective in case there are many marks carved on the surface of the resin-sealed-type semiconductor device 1 or in case an idea for making the mark 14 easy to see is needed. Other effects of the construction is similar to that of the second embodiment.

The fifth embodiment will be described now. In this embodiment, the reference surface of the metal block is divided into a plurality of areas, one of the divided areas having a recess formed therein, to which a marking die is fit.

According to this embodiment, the marking die can be fit in the recess formed on the reference surface, so that the mark can be changed at need. A mark which always has to be changed such as a manufacturing date can be easily changed, so that it is economical.

The sixth embodiment will be described now. In this embodiment, the reference surface of the metal block 11 (22) of the first or second embodiment or that formed by combining a plurality of metal blocks 11 has, taking into consideration of the size or shape of the resin-sealed-type semiconductor device 1, a shape of one of a rectangle, a rectangle having four rounded corners, a rhombus, a rhombus having rounded corners, a circle, an ellipse and a rectangle having two confronting circular or elliptic sides.

According to this embodiment, the resin-sealed-type semiconductor device can have a well-balanced surface shape by selecting the above shapes of the reference surface of the metal block 11 (22).

It is possible to reduce the sliding resistance of the metal block when the same is projected into the cavity using an ejector pin to release the resin-molded product from the resin sealing die in the second embodiment. Other effects of the construction are similar to those of the first or second embodiment.

The seventh embodiment will now be described. In this embodiment, the mark 14 carved on the reference surface of a metal block 11 (22) of the first or second embodiment are formed concave or convex relative to the reference surface. The mark 14 is convex in case the thickness of the resin-sealed-type semiconductor device 1 is 1.0 mm or more, and concave in case the same is less than 1.0 mm so as not to influence the construction design and reliability of the resin-sealed-type semiconductor device 1.

According to this embodiment, the mark 14 of the metal block 11 is concave or convex relative to the portion of the reference surface where the mark 14 is not carved, so that a clear concave or convex mark having a high quality can be imprinted on the surface of the resin-sealed-type semiconductor device 1. As described above, concave and convex marks are carved on the reference surface for thin and thick semiconductor devices respectively, so as not to influence the construction design and reliability of the resin-sealed-type semiconductor device 1. Other effects of the construction are similar to those of the first or second embodiment.

According to this embodiment, the resin sealing die in which the metal block 11 is embedded is used for sealing resin molding, so that the resin-sealed-type semiconductor device 1 which is clearly marked and highly reliable is completed.

Further, forming a frame portion integrally with the resin-sealed-type semiconductor device on the front and/or back surface thereof in such a manner as to surround the mark area prevents the mark from being broken. Moreover, the frame serves as a frame of reference for recognition by an inspection equipment, thereby enabling an inspection improved in accuracy.

We claim:

1. A resin sealing die for manufacturing a resin-sealed-type semiconductor device by sealing a semiconductor chip with sealing resin, comprising:

a cavity of the resin sealing die formed at a portion where separable upper and lower dies confront each other, at least one of the upper and lower dies comprising a hole which is open to the cavity, and a metal block having a mark carved on a reference surface thereof facing the cavity being detachably attached to the hole under substantially all molding temperature conditions.

2. A resin sealing die according to claim 1, wherein a gap between the metal block and the hole is set to 2–15 μm.

3. A resin sealing die according to claim 1, wherein the reference surface of the metal block is subjected to mirror finish or satin finish.

4. A resin sealing die according to claim 1, wherein the reference surface of the metal block is divided into a plurality of areas, which have respective marks different from one another carved thereon.

5. A resin sealing die according to claim 1, wherein the reference surface of the metal block is divided into a plurality of areas, in one of which a recess is formed and a marking die is fit in the recess.

6. A resin sealing die according to claim 1, wherein the reference surface of a metal block or that formed by combining a plurality of metal blocks has a shape of one of a rectangle, a rectangle having four rounded corners, a rhombus, a rhombus having rounded corners, a circle, an ellipse and a rectangle having two confronting circular or elliptic sides.

7. A resin sealing die according to claim 1, wherein the mark of the metal block is concave or convex.

8. A resin sealing die according to claim 7, wherein a frame is formed at an outer peripheral edge of the reference surface of the metal block comprising a mark carved thereon.

9. A resin sealing die for manufacturing a resin-sealed-type semiconductor device by sealing a semiconductor chip with sealing resin, comprising:

a cavity of the resin sealing die formed at a portion where separable upper and lower dies confront each other, at least one of the upper and lower dies comprising a hole which is open to the cavity, a through-hole which communicates with the hole, a metal block having a mark carved on the reference surface thereof facing the cavity and fit in the hole to be movable back and forth therein, an ejector pin inserted in the through-hole, the tip end of the ejector pin being connected to the metal block so as to project the metal block into the cavity by way of the ejector pin when the upper and lower dies are released from each other, and a screw arranged with the ejector pin to fix the metal block and the upper die or the lower die.

10. A resin sealing die for manufacturing a resin-sealed-type semiconductor device by sealing a semiconductor chip with sealing resin, comprising:

a cavity of the resin sealing die formed at a portion where separable upper and lower dies confront each other, at least one of the upper and lower dies comprising a hole which is open to the cavity, and a metal block having a mark carved on a reference surface thereof facing the cavity being detachably attached to the hole, and a stopper surface provided in the engraved hole.

* * * * *